United States Patent [19]

Willoteaux

[11] 4,349,769
[45] Sep. 14, 1982

[54] INCREMENTAL INTEGRATOR AND THE RESULTING SERVOSENSORS

[75] Inventor: Guy Willoteaux, St. Germain en Laye, France

[73] Assignee: Societe Francaise d'Equipements pour la Navigation Aerienne, Villacoublay, France

[21] Appl. No.: 193,269

[22] PCT Filed: Jun. 21, 1979

[86] PCT No.: PCT/FR79/00053

§ 371 Date: Feb. 26, 1980

§ 102(e) Date: Feb. 20, 1980

[87] PCT Pub. No.: WO80/00206

PCT Pub. Date: Feb. 7, 1980

[30] Foreign Application Priority Data

Jun. 26, 1978 [FR] France ............................. 78 18959
Jul. 20, 1978 [FR] France ............................. 78 21466

[51] Int. Cl.$^3$ .............................................. G05F 1/00
[52] U.S. Cl. .................................... 318/677; 318/681; 328/127; 73/503
[58] Field of Search .............. 318/677, 678, 679, 681; 328/127; 73/503

[56] References Cited

U.S. PATENT DOCUMENTS

| | | | |
|---|---|---|---|
| 3,355,952 | 12/1967 | Romberg | 73/503 |
| 3,429,189 | 2/1969 | Krabbe | 73/517 |
| 3,782,205 | 1/1974 | Fletcher | 73/497 |
| 3,842,371 | 10/1974 | Kelley | 331/143 |
| 4,001,662 | 1/1977 | LeGallais | 318/678 X |
| 4,263,627 | 4/1981 | Rose | 318/561 X |
| 4,280,083 | 7/1981 | Hirai | 318/561 X |

OTHER PUBLICATIONS

Strong, *LSI converts an old technique into low cost AD conversion,* in Electronics, pp. 102–105, Sep. 11, 1972.

Horner et al., *DMM and DAC Modules Expand Low Cost Measuring System,* Hewlett Packer Journal, pp. 7–14, vol. 24, Jun. 1973.

*Primary Examiner*—B. Dobeck

[57] ABSTRACT

Precision incremental-output integrator of the type comprising: an operational amplifier mounted as analog summing integrator, which sums currents $I_1$ and $I_2$ at the integrator input, characterized by the fact that current $I_2$ is obtained by the discharge of a capacitor $C_2$ and that the symmetrical reference voltage generator $(Vr-)$, $(Vr+)$ is replaced by a simple voltage generator $(Vr)$ and incremental-output servosensors resulting from utilization of the said precision incremental-output integrator in which the measured magnitude, originally electrical, becomes a physical magnitude, evidenced by an electromechanical force generator by the fact that the analog amplifier of the precision incremental-output integrator (terminals A-S, FIG. 2) is replaced by the force generator of the servosensor (FIG. 3), the return current of which is current $I_2$ discharged from capacitor $C_2$.

10 Claims, 4 Drawing Figures

INCREMENTAL INTEGRATOR AND THE RESULTING SERVOSENSORS

The purpose of the present invention is the development of a precision integrator and the incremental-output servosensors resulting from it.

This invention is particularly applicable to integrators with an operational amplifier mounted as a summing integrator that sums currents $I_1$ and $I_2$ at the integrator input and in which the current $I_2$ may result from the connection of a resistor $R_2$ to a symmetrical reference voltage generator (Vr−), (Vr+) through two switches (FIG. 1); as the output of the analog integrator (point S) is connected on the one hand, to a reversing switch via a flip-flop which gives the sign of the output voltage and on the other hand, to a level detector via a full-wave rectifier; this detector controls a monostable circuit connected to each of the two switches through the reversing switch, the effect of which is to deliver through resistor $R_2$ quantities of electricity calibrated according to the following formula:

$$\Delta Q = I_2 \Delta t \text{ with } I_2 = \text{constant} \quad (1)$$

or $$\Delta Q = \frac{Vr\pm}{R_2} \times \Delta t \quad (2)$$

The main difficulty in the realization of known incremental-output integrators lies in the fact that the quantity of electricity is generally defined by a current pulse of calibrated intensity and duration.

Another disadvantage with the known system is that two symmetrical and adjusted reference voltages are necessary.

A further disadvantage with known systems of this type is linked with their sensitivity to switching speed on the one hand and to the spurious conduction resistance of the switches on the other hand.

All of these disadvantages are suppressed in the precision incremental-output integrator according to the present invention.

In this new integrator the current $I_2$ is obtained by the discharge of a capacitor $C_2$, delivering quantities of electricity calibrated according to the following formula:

$$\Delta Q = C_2 Vr \quad (3)$$

The present invention also concerns an incremental-output servosensor resulting from the use of the said precision incremental-output integrator. This is a sensor in which the magnitude to be measured, originally electrical, becomes a physical magnitude shown by an electromechanical force generator, owing to the fact that the analog amplifier of the precision incremental-output integrator (terminals A-S, FIG. 2) is replaced by the force generator of the servosensor (FIG. 3), the return current of which is current $I_2$ discharged by capacitor $C_2$.

One of the prime aims of this sensor is to minimize the difference between a measured magnitude converted into force and the return force, and to express it in digital form.

Another aim of this sensor is to be applicable generally to all the servosensors in all cases where the magnitude to be measured can be converted into a force, implying a force generator such as an electromagnet for instance intended to measure an acceleration or an angular velocity, to give just two examples.

The features and advantages of the invention will be explained in the description following and the appended drawings, but the features and advantages listed are not exhaustive.

FIGS. 1 and 2 attached represent respectively a known integrator circuit (FIG. 1) and the precision integrator according to the present invention (FIG. 2).

Figure 1:
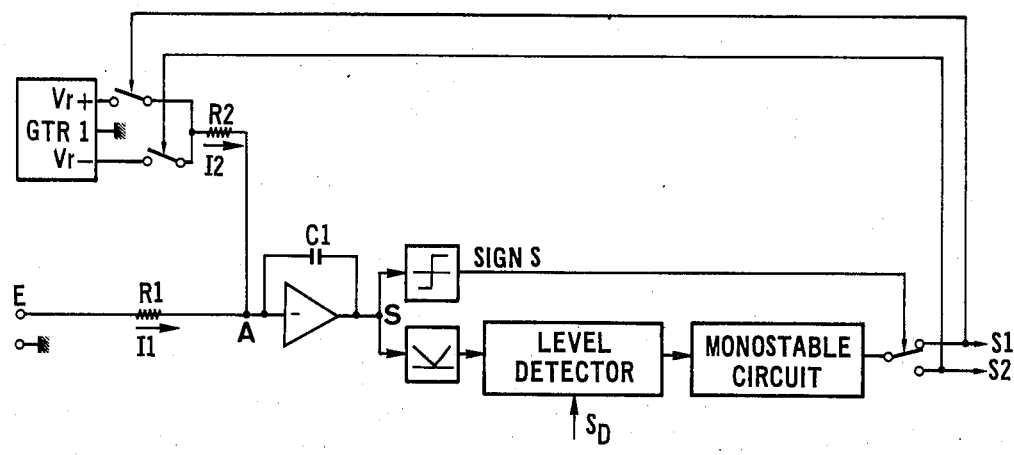

FIG. 1 shows a precision incremental-output integrator of the type comprising: an operational amplifier mounted as an analog summing integrator which sums currents $I_1$ and $I_2$ at the integrator input (point A); a current $I_2$ that may result from connecting a resistor $R_2$ to a symmetrical reference voltage generator (Vr−), (Vr+) via two switches (FIG. 1); the output of the analog integrator (point S) is connected on the one hand to a reversing switch via a flip-flop that gives the sign of the output voltage, and on the other hand to a level detector through a full-wave rectifier, the said detector controlling a monostable circuit connected to each one of both switches through the reversing switch, the effect of which is to deliver through resistor $R_2$ (FIG. 1) quantities of electricity calibrated according to formulas (1) and (2) above.

In the precision integrator according to the present invention (FIG. 2) the current $I_2$ is obtained by the discharge of a capacitor $C_2$ and the symmetrical reference voltage generator (Vr−), (Vr+) is replaced by a simple voltage generator (Vr).

The quantities of electricity delivered are calibrated according to the formula:

$$\Delta Q = C_2 Vr \quad (3)$$

Moreover, dual charging and discharging switches are provided, connected in parallel to capacitor $C_2$. The above-mentioned charging switch is directly controlled by monostable circuit 7 and the above-mentioned reversing switch 3 controls the discharging switches.

As above, the output of the analog integrator (point S) is connected to the reversing switch through a flip-flop 4 that gives the sign of the output voltage, as well as to a level detector through a full-wave rectifier 6; this detector 5 controls the above-mentioned monostable circuit 7.

We shall now describe the operation of the invention precision integrator.

Generally speaking, an incremental-output integrator comprises an analog integrator whose output voltage (S) is servoed by a supplementary negative feedback loop so that it remains between two arbitrary limits: $-S_D$ and $+S_D$; $-S_D \leq S \leq S_D$.

$S_D$ is the threshold of the level detector.

As long as the output voltage (S) of the analog integrator is between the limits $-S_D$ and $+S_D$, the two switches are open (FIG. 1) and current $I_2$ is zero.

When the voltage (S) reaches one of limits $-S_D$ or $+S_D$ as a result of current $I_1$, the level detector commands the monostable circuit which immediately closes a switch for an extremely precise period.

The commanded switch is determined according to the sign of voltage S, so as to bring the latter back to zero. The pulse coming from the monostable circuit 7 is connected to one of the corresponding outputs S1 or S2.

In the precision integrator according to the invention (FIG. 2), when the output voltage of the analog integrator (S) is between the above-mentioned limits $-S_D$ and $+S_D$, the dual charging switch is closed and the dual discharging switches are open. Capacitor $C_2$ is therefore charged at reference voltage Vr, and still in the same direction.

As in the previous case, when $S = \pm S_D$, the level detector commands a monostable trigger; this opens the dual charging switch of capacitor $C_2$ and closes one of the dual discharging switches. The commanded dual discharge switch is determined according to the sign of the voltage S so that the latter is brought back to zero.

The discharge command pulse coming from the monostable trigger (line 3) is connected to one of outputs S1 or S2 depending on the position of the reversing switch.

It should finally be noted that another less evident advantage of the precision integrator according to the present invention is that it permits the utilization of a wide tolerance monostable circuit, which was not possible in the existing system which required a close tolerance monostable circuit.

An integrator of this type has multiple uses. It can especially be used in aeronautics to digitize the output of a sensor such as a servoed-return accelerometer for example (Stradpdown technique).

Figure 2:
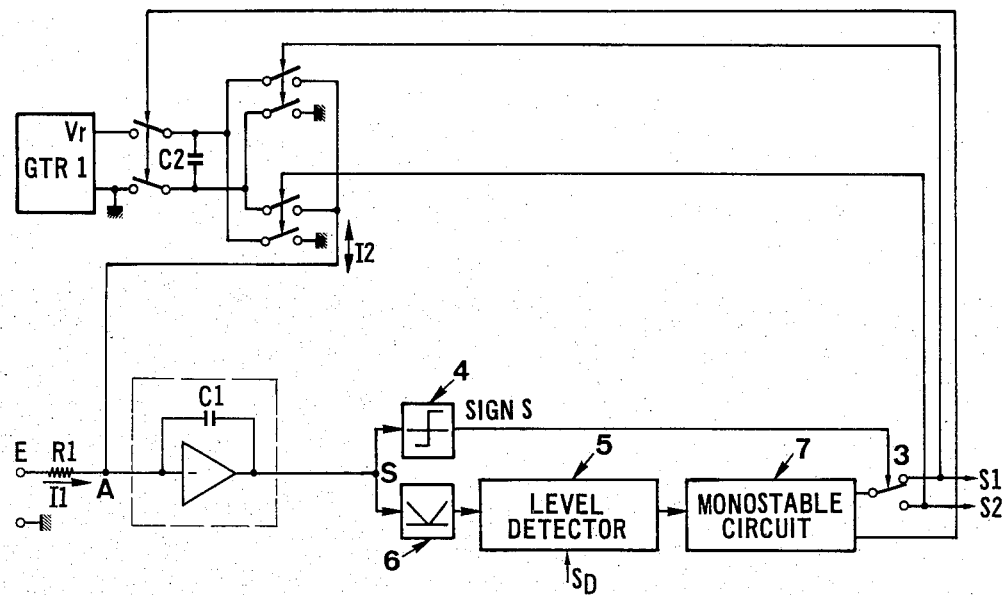
Figure 3:
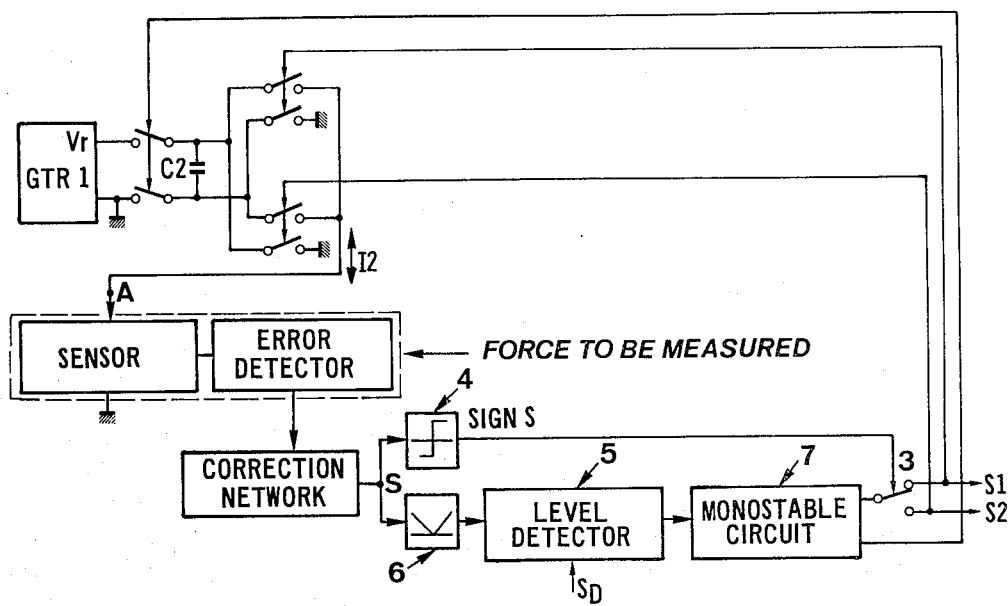
FIG. 3 is a diagram of the incremental-output servosensor resulting from the use of the precision integrator according to the present invention (FIG. 2).

In this case, the system according to the invention consists of replacing the magnitude, originally electrical, measured by the analog integrator between A and S, located in the dotted area in FIG. 2, by a physical magnitude shown by a known servosensor, between terminals A and S of FIG. 3.

The whole loop outside the said area remains unchanged, going from terminal S to terminal A or vice versa, and comprises:
  a simple voltage generator Vr,
  dual loading and unloading switches, connected in parallel to capacitor C2,
  monostable circuit 7 directly controlling the loading switch; and reversing switch 3 controlling the discharge switches.

Output S of the above-mentioned device is connected on the one hand to the reversing switch 3 via a flip-flop 4 that gives the sign of the output voltage; and on the other hand to level detector 5 via a full-wave rectifier 6; the said detector 5 controlling the monostable circuit 7.

Figure 4:
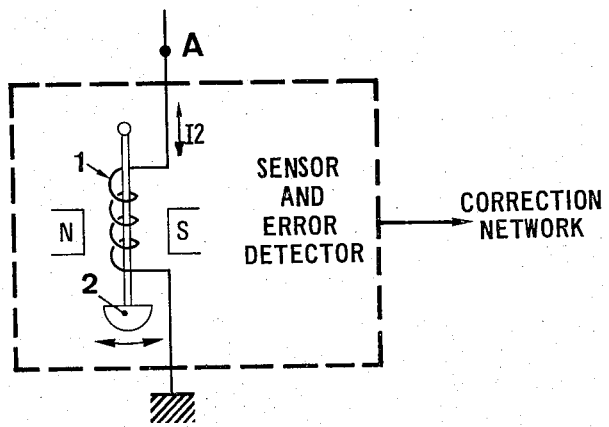
FIG. 4 is an enlarged representation of the dotted area on FIG. 3.

The servosensor comprises: a return coil 1 controlling a mobile part 2, represented by a pendulum in the case in question, moving in a magnetic field, indicated by the magnet notation N and S (FIG. 4).

The incremental-output servosensor resulting from this system operates as follows: the force and/or magnitude to be measured, whether an acceleration or a gyration, acts on the mobile part of the sensor; its error detector is connected to a phase and gain correcting network, the output of which controls reversing switch 3 from point S.

Discharge current $I_2$ of capacitor $C_2$ can cross return coil 1 of the sensor in either direction (FIG. 4).

Servoing of the known sensor, including the error detector and its phase correcting network becomes an incremental loop by means of the system according to the present invention.

Of course, the above-mentioned physical magnitude may be shown by an electromechanical and/or electromagnetic force generator.

I claim:
1. Incremental output integrator comprising:
  an analog summing integrator amplifier comprising an input intended to be connected to a generator delivering a current $I_1$ representing a magnitude to be measured:
  a capacitance connected to the second input of the summing amplifier by a controllable inverter having two control terminals;
  a voltage generator connected to the terminals of said capacitance by a double load switch;
  a control circuit of said inverter comprising at least a high and low level detector of the output voltage of the summing integrator and means to transmit a control signal to one or other of the control terminals of the inverter depending on whether the level detected is a high level or a low level;
  two output terminals connected to the control terminals of the inverter, and
  a circuit controlling one or the other side of the double load switch when the output voltage of the summing integrator reaches one or other of the two levels, and then to turn the double load switch off at the end of a time equal at least to the capacitor discharge time.

2. Incremental output integrator according to claim 1, wherein the inverter control circuit comprises, in series, a double half-wave rectifier whose input is connected to the output of said summing amplifier, a level detector and a monostable circuit whose first output is connected to the two control terminals of the inverter by a selector controlled by a sign detector whose input is connected to the output of the summing integrator amplifier, and whose complementary output is connected to the control terminal of the double load switch.

3. Incremental output servosensor comprising:
  a capacitance fed by a voltage generator and a double load switch;
  a sensor connected to the terminals of the capacitance by a controllable inverter having two control terminals;
  a shift detector connected to the sensor output;
  a control circuit of said inverter comprising at least a high low level detector of the output voltage of the shift detector and means to transmit a control signal to one or other of the control terminals of the inverter, depending on whether the level detected is of a high level or a low level;
  two output terminals connected to the control terminals of the inverter, and
  a circuit controlling one or the other side of the double load switch on when the output voltage of the summing integrator reaches one or other of said levels and then to turn the double load switch off at the end of a time at least equal to the capacitance discharge time.

4. Servosensor according to claim 3, further comprising a corrective network connected to the output of the shift detector.

5. Servosensor according to claim 3, wherein the control circuit of the inverter comprises, in series, a double half-wave rectifier whose input is connected to the output of the shift detector, a level detector and a monostable circuit whose first output is connected to the two control terminals of the inverter by a selector controlled by a sign detector whose input is connected to the output of the shift detector and whose complemented output is connected to the control terminal of the double load switch.

6. Servosensor according to claim 3, wherein the sensor and shift detector are integrated in the same device comprising a movable member in a stationary magnetic field which generates a signal proportional to the magnitude to be measured, said movable member comprising a recall coil through which passes the capacitance discharge current, delivered by said inverter, and a position sensor of said movable member followed by a shift detector.

7. An incremental output integrator of the type which performs an analog summing integration of the currents $I_1$ and $I_2$ at an integration point, which adjusts the value of the integrated sum signal at said integration point to hold said signal in a predetermined range of values and which includes means for feeding back said sum signal to control one of said two currents $I_1$ and $I_2$, the improvement comprising a simple uni-directional voltage generator, a capacitor, capacitor charging switch means interconnecting said voltage generator to said capacitor to selectively charge said capacitor, dual capacitor discharging switch means selectively operated by said feedback means to control the sign of said one of said two currents $I_1$ and $I_2$ fed from said capacitor to said integration point, and said feedback means controlling said capacitor charging and discharging switch means so that said one of said two currents $I_1$ and $I_2$ is fed from said capacitor via one of said dual discharge switches to said integration point at times in amounts and of a sign necessary to sum with said other of said currents $I_1$ and $I_2$ so that the sum of the two currents $I_1$ and $I_2$ is within said predetermined range.

8. The integrator of claim 10, wherein said range includes zero at its center and said currents $I_1$ and $I_2$ are made to be equal and of opposite sign.

9. The combination of claim 10, wherein said feedback means includes an integrator connected to said analog integration point.

10. An incremental output servosensor including the integrator of claim 10 or 11, wherein one of said currents $I_1$ and $I_2$ is representative of a physical magnitude to be measured, and transducer means in said feedback means for transforming said physical magnitude into said one of said currents $I_1$ and $I_2$.

* * * * *